(12) United States Patent
Hobart et al.

(10) Patent No.: US 11,131,039 B2
(45) Date of Patent: Sep. 28, 2021

(54) DIAMOND ON NANOPATTERNED SUBSTRATE

(71) Applicant: The Government of the United States of America, as represented by the Secretary of the Navy, Arlington, VA (US)

(72) Inventors: Karl D. Hobart, Alexandria, VA (US); Tatyana I. Feygelson, Springfield, VA (US); Marko J. Tadjer, Springfield, VA (US); Travis J. Anderson, Alexandria, VA (US); Andrew D. Koehler, Alexandria, VA (US); Samuel Graham, Jr., Lithonia, GA (US); Mark Goorsky, Valencia, CA (US); Zhe Cheng, Atlanta, GA (US); Luke Yates, Atlanta, GA (US); Tingyu Bai, Los Angeles, CA (US); Yekan Wang, Los Angeles, CA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/420,366

(22) Filed: May 23, 2019

(65) Prior Publication Data
US 2019/0360117 A1 Nov. 28, 2019

Related U.S. Application Data

(60) Provisional application No. 62/676,294, filed on May 25, 2018.

(51) Int. Cl.
*C30B 29/04* (2006.01)
*C30B 25/18* (2006.01)

(52) U.S. Cl.
CPC .............. *C30B 29/04* (2013.01); *C30B 25/18* (2013.01)

(58) Field of Classification Search
CPC ......... C30B 25/18; C30B 29/04; C30B 29/60; C30B 25/186; C30B 19/12; B32B 3/00;
(Continued)

(56) References Cited

U.S. PATENT DOCUMENTS 5,391,422 A 2/1995 Omori et al.
8,039,301 B2 10/2011 Kub et al.
(Continued)

FOREIGN PATENT DOCUMENTS

JP 0327863 A 12/1991

OTHER PUBLICATIONS

J.E. Graebner, et al., "Unusually high thermal conductivity in diamond films," Appl. Phys. Lett. 60, 1576 (1992).
(Continued)

*Primary Examiner* — Maria V Ewald
*Assistant Examiner* — Ethan Weydemeyer
(74) *Attorney, Agent, or Firm* — US Naval Research Laboratory; Joslyn J. Barritt

(57) ABSTRACT

A method for growing polycrystalline diamond films having engineered grain growth and microstructure. Grain growth of a polycrystalline diamond film on a substrate is manipulated by growing the diamond on a nanopatterned substrate having features on the order of the initial grain size of the diamond film. By growing the diamond on such nanopatterned substrates, the crystal texture of a polycrystalline diamond film can be engineered to favor the preferred <110> orientation texture, which in turn enhances the thermal conductivity of the diamond film.

7 Claims, 10 Drawing Sheets

(58) Field of Classification Search
CPC ....... B32B 3/26; B32B 3/30; H01L 21/02433; H01L 21/02639; H01L 21/02609; H01L 29/1602; Y10T 428/24479; Y10T 428/2457; Y10T 428/24579; Y10T 428/24587
See application file for complete search history.

(56) References Cited

U.S. PATENT DOCUMENTS

| | | | |
|---|---|---|---|
| 8,445,383 | B2 | 5/2013 | Hobart et al. |
| 9,159,641 | B2 | 10/2015 | Hobart et al. |
| 9,305,858 | B2 | 4/2016 | Hobart et al. |
| 9,331,163 | B2 | 5/2016 | Koehler et al. |
| 9,466,684 | B2 | 10/2016 | Koehler et al. |
| 2007/0224727 | A1 | 9/2007 | Dory |
| 2014/0209014 | A1* | 7/2014 | Chang ............... C30B 25/186 117/95 |
| 2014/0335274 | A1 | 11/2014 | Vandenryt et al. |
| 2017/0233890 | A1 | 8/2017 | Nishibayashi et al. |

OTHER PUBLICATIONS

J.E. Graebner, et al., "Sources of thermal resistance in chemically vapor deposited diamond," Diam. Relat. Mater. 5, 682 (1996).
N. Govindaraju, et al., "Comparative study of textured diamond films by thermal conductivity measurements," Applied Physics A 85, 331-335 (2006).
J. Anaya, et al., "Simultaneous determination of the lattice thermal conductivity and grain/grain thermal resistance in polycrystalline diamond," Acta Materilia 139, p. 215-225, (2017).
Search Report and Written Opinion dated Sep. 18, 2019 in corresponding International Application No. PCT/US2019/033661.

* cited by examiner

DIAMOND ON NANOPATTERNED SUBSTRATE

CROSS-REFERENCE

This Application is a Nonprovisional of and claims the benefit of priority under 35 U.S.C. § 119 based on U.S. Provisional Patent Application No. 62/676,294 filed on Jun. 25, 2018. The Provisional Application and all references cited herein are hereby incorporated by reference into the present disclosure in their entirety.

TECHNICAL FIELD

The purpose of the invention is to obtain polycrystalline diamond films having improved thermal properties by growing such films by chemical vapor deposition on substrates incorporating nano-scale features to promote a preferred crystal orientation that leads to improved thermal properties.

BACKGROUND

Synthetic polycrystalline diamond grown by chemical vapor deposition (CVD) is used extensively for thermal management of high power components in order to improve the performance and reliability of such components by reducing the device operating temperature.

Single crystals of diamond have the highest known thermal conductivity of any material; however, the small form factor and high cost of single crystal diamond limits its practical application to thermal management of high power electronic components.

Polycrystalline diamond plates, however, can be grown in large area and have applications for heat sinks and thermal spreaders. Although thick (>100 µm) polycrystalline diamond plates can achieve thermal conductivity approaching that of single crystal diamond, thin films of polycrystalline diamond have much reduced thermal conductivity due to the size and orientation of the grains.

Studies have found that the thermal conductivity of diamond films at the initial stages of their growth is low due to the presence of smaller sized grains, which subsequently increase in size as the film becomes thicker. See J. E. Graebner, et al., "Unusually high thermal conductivity in diamond films," *Appl. Phys. Lett.* 60, 1576 (1992) and J. E. Graebner, et al., "Sources of thermal resistance in chemically vapor deposited diamond," *Diam. Relat. Mater.* 5, 682 (1996)

However, another factor that impacts thermal conductivity is the preferred orientation of the diamond grains, also often referred to as their "texture." Studies have shown that the preferred orientation for improved thermal conductivity of diamond is the <110> texture, as opposed to the more common <111> texture. See N. Govindaraju, et al., "Comparative study of textured diamond films by thermal conductivity measurements," *Applied Physics A* 85, 331-335 (2006). The preferred <110> texture is achieved by modifying the chemical vapor deposition growth conditions and by growing very thick films (>100 µm), with polycrystalline diamond films grown to a thickness of >100 µm showing both the preferred <110> texture and high thermal conductivity (>1500 W/mK)>.

In contrast, thin films (<10 µm) have a random texture, typically a mix of <111> and <110> textures, and consequently exhibit a lower thermal conductivity (<300 W/mK).

There is therefore substantial interest in improving the thermal conductivity of thin (<10 µm)diamond films for integration into high power electronics devices. See U.S. Pat. Nos. 9,331,163 and 9,466,684 to Hobart et al., both entitled "Transistor with Diamond Gate."

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention manipulates the grain growth on the nano-scale by growing the diamond on a substrate having a plurality of nanopatterned features on the upper surface thereof, where the size of the nanopatterned features typically ranges from about 60 to about 400 nm but can be as small as about 4 nm. By growing the diamond on such nanopatterned substrates, the crystal texture of a polycrystalline diamond film can be engineered to favor the preferred <110> orientation texture, which in turn enhances the thermal conductivity of the diamond film, with smaller features producing greater improvements in the thermal conductivity. Thus, in accordance with the present invention, by engineering the size of the features in the nanopatterned substrate, the microstructure of the diamond film can be tailored in a predictable manor to provide a predetermined level of thermal conductivity in the diamond film.

BRIEF DESCRIPTION OF THE DRAWINGS

FIG. 3A is a plan-view TEM graph of the plane just above the diamond-silicon interface and FIG. 3B is a cross-section TEM graph of diamond-silicon interface.

FIG. 4A shows the grain size distribution on a patterned sample and FIG. 4B shows the grain size distribution on a flat sample.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention exploits the growth habit of polycrystalline diamond on nano-scale patterned surfaces.

During initial stages of growth from surfaces seeded with nanocrystalline diamond particles, diamond grows isotropically until the crystallites coalesce at which point the growth mode is columnar with competition between diamond grains. See U.S. Pat. No. 8,445,383 to Hobart et al., entitled "Transparent Nanocrystalline Diamond Contacts to Wide Bandgap Semiconductor Devices." Earlier observations of polycrystalline diamond growth on three dimensional patterned structures showed accelerated diamond growth rate at corners of the structures. See U.S. Pat. Nos. 9,159,641 and 9,305,858 to Hobart et al., both entitled "Nanocrystalline Diamond Three-Dimensional Films in Patterned Semiconductor Substrate." This behavior is due to reduced competition between adjacent grains on the free corner and results in larger and faster grain growth on the submicrometer-scale.

The present invention manipulates the grain growth on the nano-scale by growing the diamond on a nanopatterned substrate having features on the order of the initial grain size of the diamond film. By growing the diamond on such nanopatterned substrates, the crystal texture of a polycrystalline diamond film can be engineered to favor the preferred <110> orientation texture, which in turn enhances the thermal conductivity of the diamond film. Thus, by engineering the nanopatterned substrate, the present invention tailors the microstructure of the diamond film in a predictable manor. As described below, X-ray diffraction data shows that the degree of preferred <110> orientation texture scales inversely with nanoscale feature size (i.e., the Top Width in FIG. 1A described below). This strong correlation suggests the diamond microstructure is impacted by the nanoscale feature of the substrate which is also corroborated by the thermal conductivity which is known to be impacted by the preferred <110> orientation texture.

Thus, in accordance with the present invention, diamond films are grown by chemical vapor deposition on nanopatterned substrates, where the size and geometry of the features can be tailored to obtain a predetermined improvement in the thermal conductivity.

Figure 1A:
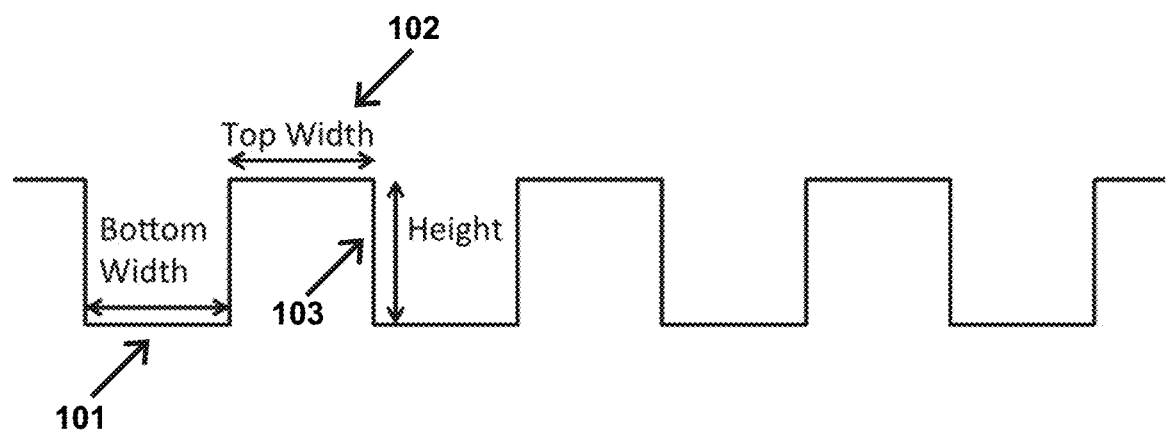
FIGS. 1A and 1B are block schematics illustrating a cross-sectional view (FIG. 1A) and a perspective view (FIG. 1B) of an exemplary nanopatterned substrate that can be used for diamond growth in accordance with the present invention.
Figure 1B:
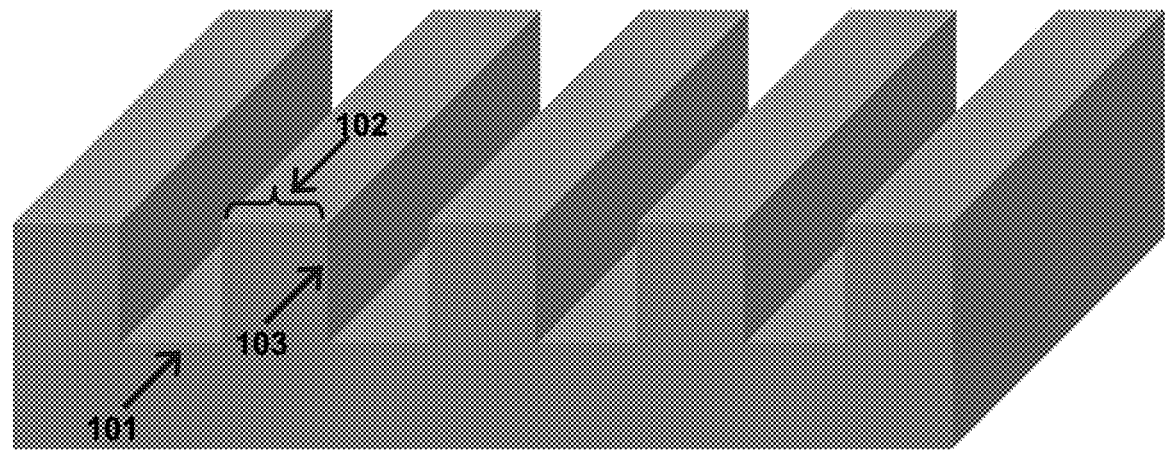
Figure 2:
FIG. 2 is a block schematic illustrating the exemplary nanopatterned substrate shown in FIG. 1B with diamond grown thereon.

FIGS. 1A and 1B illustrate aspects of an exemplary nanopatterned substrate that can be used to grow a polycrystalline diamond thin film having improved thermal conductivity in accordance with the present invention, where FIG. 1A is a block diagram showing a cross-sectional view and FIG. 1B is a perspective view of such a substrate. As illustrated in FIGS. 1A and 1B, in an exemplary embodiment, such a nanopatterned substrate can be patterned in a trench geometry, where the trenches have a bottom width 101, a top width 102, and a height 103. As illustrated in FIG. 2, diamond grown on such a nanopatterned substrate will fill in the trenches to form an interleaved pattern of silicon and diamond at the interface between the diamond and the substrate. As described in more detail below, the geometric parameters of the trenches can be tailored to obtain the preferred <110> grain orientation of a polycrystalline diamond thin film and to obtain a predetermined improvement in thermal conductivity of such a diamond film.

Examples

Experiments were performed to demonstrate the concept underlying the present invention, i.e., that growing diamond films on nanopatterned substrates having features on the order of the initial grain size can obtain films having the preferential <110> texture and improved thermal conductivity.

Diamond samples grown on three different patterned silicon substrates (Substrates A, B, and C) having the trench geometries (bottom width, top width, and height) shown in Table I and on a on a control substrate having a planar (unpatterned flat) surface. In the discussion herein, the Sample numbers refer to the substrate used and the thickness of the film grown thereon; for example, "Sample A2" is a 2 µm-thick diamond film grown on Substrate A.

Table I below shows the geometrical parameters and the experimentally realized feature sizes for each of Samples A2, B2, C2 grown on a nanopatterned substrate in accordance with the present invention and Sample ref2 grown on a flat planar substrate in accordance with the prior art.

TABLE I

| Sample | Height (nm) | Top Width (nm) | Bottom Width (nm) | $\frac{I_{111}}{I_{220}}$ | Total Thermal Resistance ($m^2K/GW$) |
|---|---|---|---|---|---|
| A2 | 47 | 60 | 77 | 0.88 | 15.8 |
| B2 | 105 | 205 | 215 | 1.13 | 17.0 |
| C2 | 195 | 400 | 435 | 1.46 | 18.8 |
| ref2 | 0 | 0 | 0 | 1.46 | 23.8 |

The diamond films were grown on the four nanopatterned substrates A, B, C, and the flat reference substrate by means of a two-step process described below.

In the first step, the substrates were immersed in an ethanol solution of suspended detonation nanodiamond particles having a mean diameter of 4 nm and a diamond concentration of 5 grams/liter of solution, where the suspension of nanodiamond seed particles was formed by high power ultrasonic treatment of the solution. Following preparation of the solution, the samples were immersed in the solution with ultrasonic agitation for 20 minutes to produce a seed layer of diamond particles that conformally cover the nanopatterned features on the substrate.

After growth of the seed layer, the samples were rinsed in pure ethanol and dried.

In the second step, a polycrystalline diamond film was grown on the substrate by microwave-enhanced chemical vapor deposition at a substrate temperature of 750° C. in a gas stream of hydrogen and methane, with a methane concentration of 0.5% and under a pressure was 7 torr and a microwave power of 1400 watts. The grain size of the diamond crystals in the polycrystalline diamond film started at about the initial grain size of 4 nm but rapidly expanded to about 10 nm as the small grains coalesced into larger grains. The grain size continued to grow to about 100 to about 200 nm, with additional growth being made in the vertical direction to produce films having thicknesses of 1 to 2 μm. The inventors found that during such growth, the diamond grains more quickly than they did on the flat reference substrate, and more significantly, that the <110> oriented grains favored to increase the diamond's thermal conductivity, grew more quickly than grains having other orientations, causing the film to more strongly exhibit a <110> orientation texture.

In the Example films examined by the inventors, the nanopatterned feature sizes ranged from about 60 to about 400 nm in width, but substrates having features with smaller sizes, even as small as the initial diamond grain size of 4 nm, can be used, and it is predicted that such smaller features will produce even greater improvements in the thermal conductivity of the diamond films grown thereon.

Figure 3A:
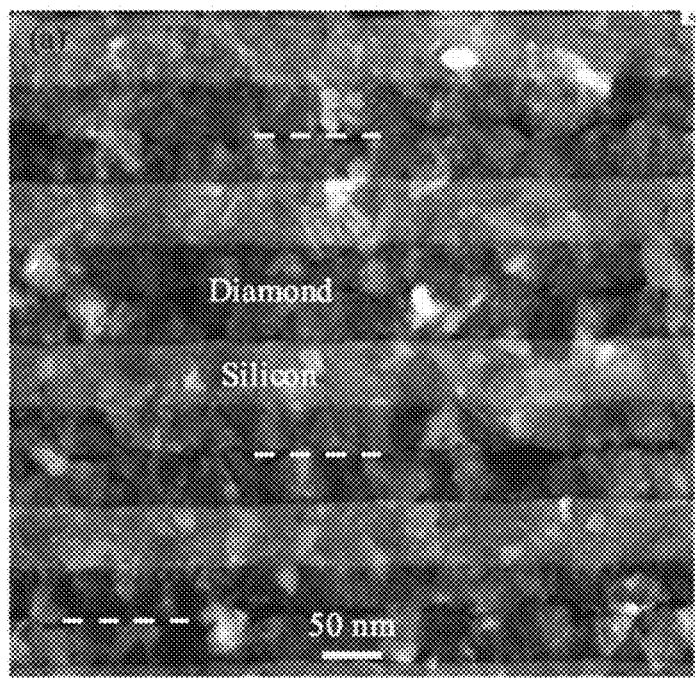
FIGS. 3A and 3B are micrographic images illustrating the grain structure of an exemplary diamond film grown on a patterned Si substrate, where
Figure 3B:
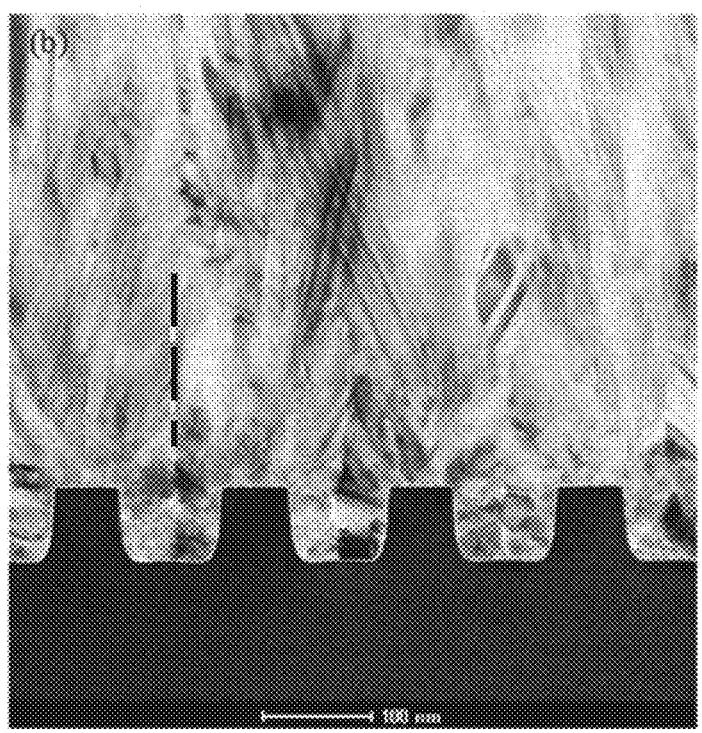

FIGS. 3A and 3B show a transmission electron microscopy (TEM) plan view (FIG. 3A) and cross sectional view (FIG. 3B) images of a 1 μm thick film grown on Sample A (Sample A1). In this case the plan view was taken from a slice near the growth interface (silicon-diamond interface), and shows that the diamond has filled in the trenches between the silicon mesas. As can be seen from the cross-sectional view in FIG. 3B, the diamond film conformally covers the nanopatterned substrate. In both FIGS. 3A and 3B, grain boundaries in the diamond film at the center of each trench are readily visible. The presence of these grain boundaries at the bottom of the trenches indicates that diamond grains growing on top of the nanopatterned mesas (i.e., Top Width 102 shown in FIG. 1A) on the substrate grow more quickly and dominate the growth process, leading to a larger population of large grains and a lower population of small grains (and eliminating the smallest grains as show below). This is direct evidence that the nanopatterned features on the substrate affect the diamond growth behavior.

Figure 4A:
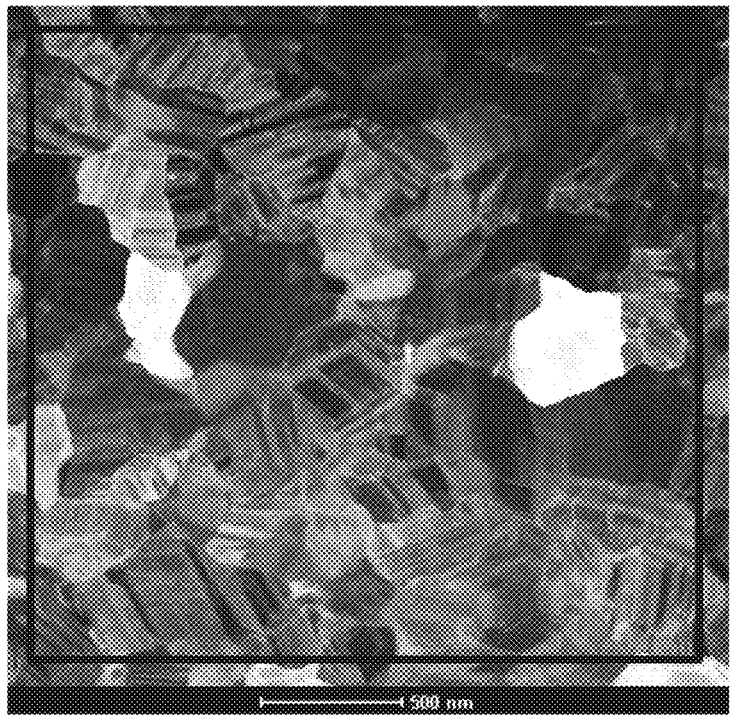
FIGS. 4A and 4B are plan-view TEM graphs showing diamond grain size distribution near the growth side of two exemplary 2 µm samples, where
Figure 4B:
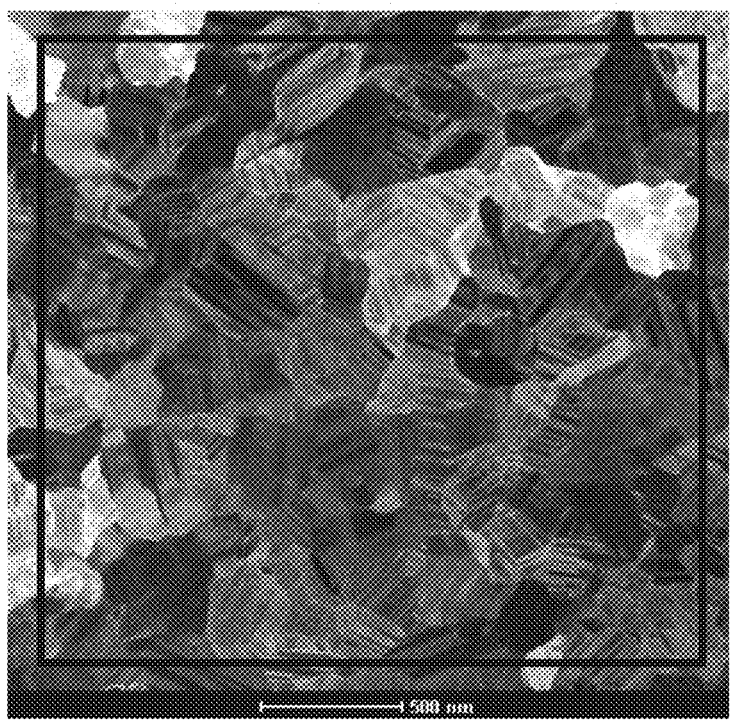
Figure 5:
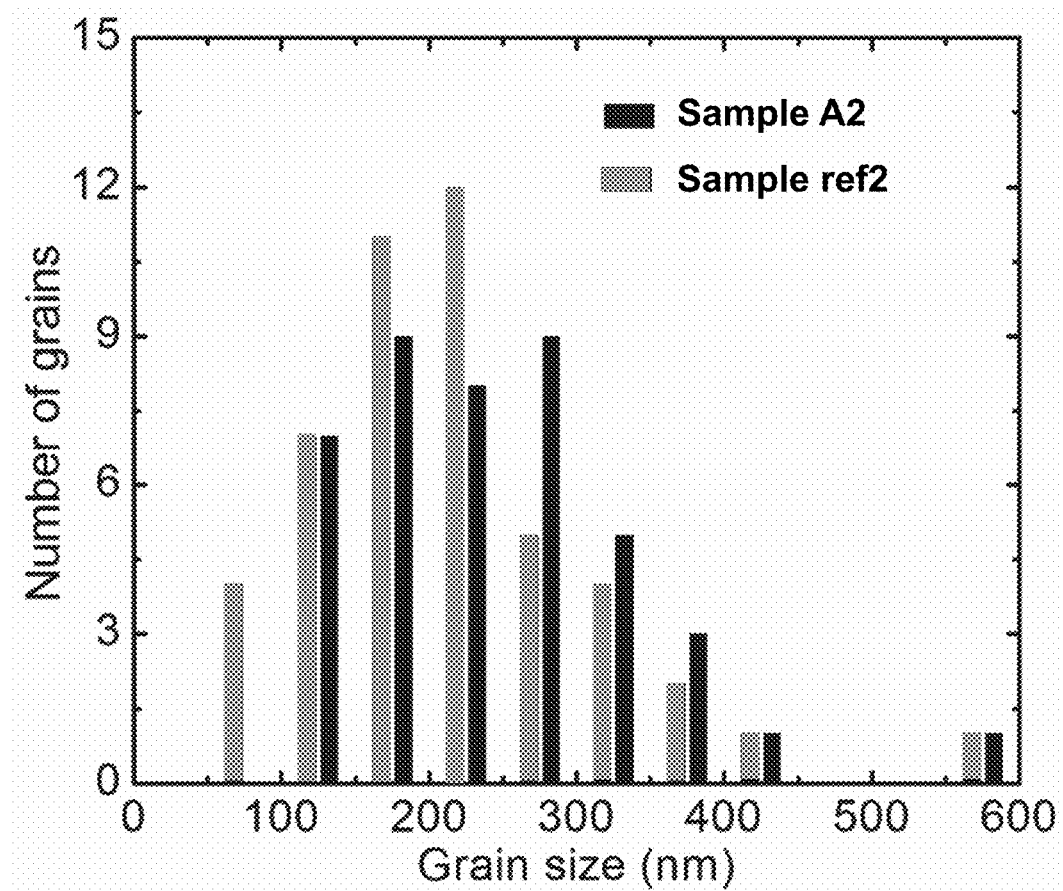
FIG. 5 is a graph showing the diamond grain size distribution in the samples depicted in FIGS. 4A and 4B.

The microstructure of the diamond films was further analyzed by the inventors to determine the effect of the nanopatterned substrate on diamond growth. FIG. 4A and FIG. 4B are TEM plan view images of 2 μm diamond films grown on nanopatterned substrate A (Sample A2; FIG. 4A) and on the flat reference substrate (Sample ref2; FIG. 4B), with the images being taken from a slice at the top surface of the diamond. Both FIGS. 4A and 4B show the presence of multiple grains and grain boundaries in the diamond films. The grains in the areas inside the 2.3 μm×2.3 μm box were analyzed and the results are shown in the histogram in FIG. 5. The average grain size for nanopatterned substrate Sample A2 and flat reference substrate ref2 were 247 nm and 216 nm, respectively; however, there were fewer very small grains in the nanopatterned sample, which demonstrates that the nanopatterned substrate accelerates grain growth compared to a flat substrate.

The microstructure was further analyzed by X-ray diffraction (XRD), in which the intensity of the (220) reflection peak tracks the amount of (110) orientation texture while the (111) reflection peak tracks the amount of (111) orientation texture.

Figure 6A:
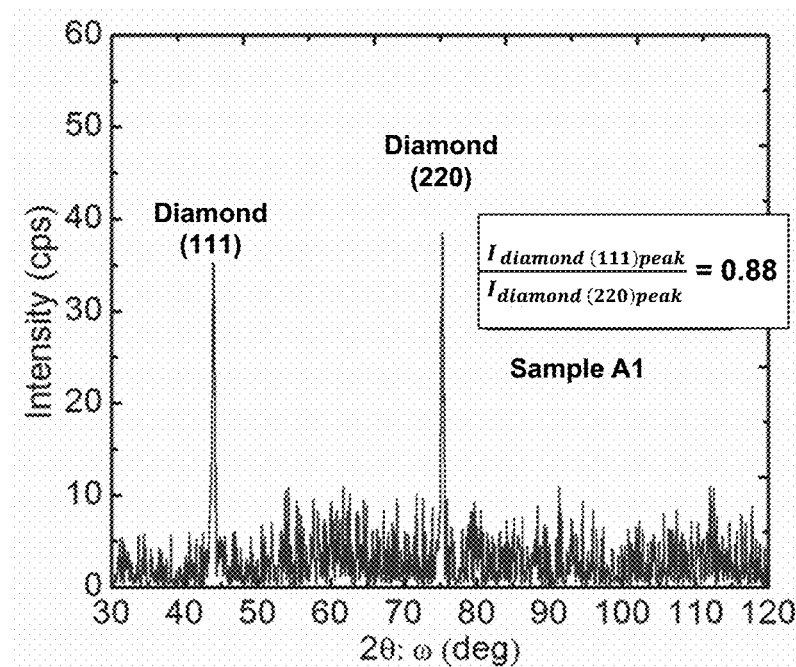
FIGS. 6A and 6B are images of XRD scans for two 1 µm thick diamond samples showing the texturing on a patterned substrate (FIG. 6A) and a flat substrate (FIG. 6B).
Figure 6B:
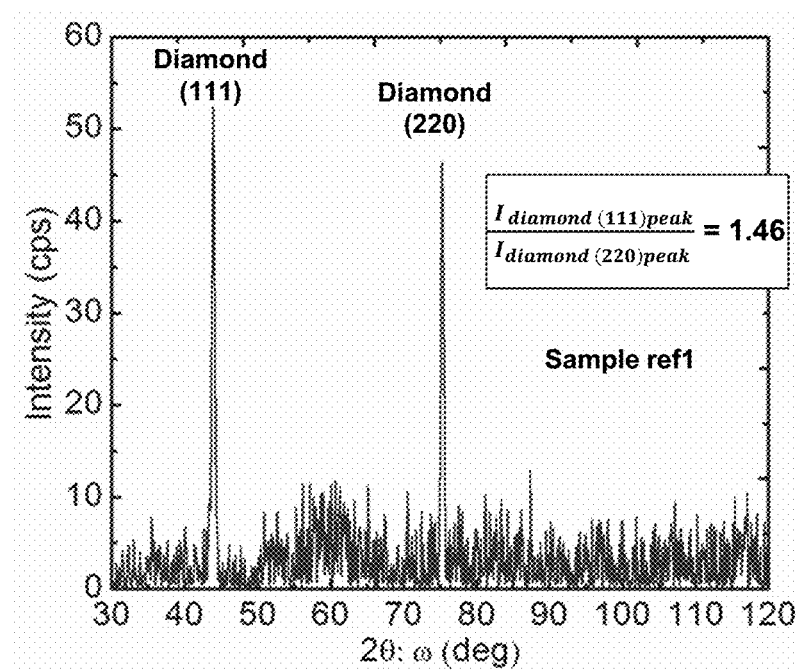

FIGS. 6A and 6B show XRD spectra of 1 μm thick diamond films on nanopatterned substrate A (Sample A1; FIG. 6A) and on the flat reference substrate (sample ref1; FIG. 6B). It can be observed that the intensity of the (111) reflection shrinks with respect to the preferred (220) reflection when the substrate is patterned compared to the flat substrate. This is further evidence that the patterned substrate is driving the microstructure.

Figure 7:
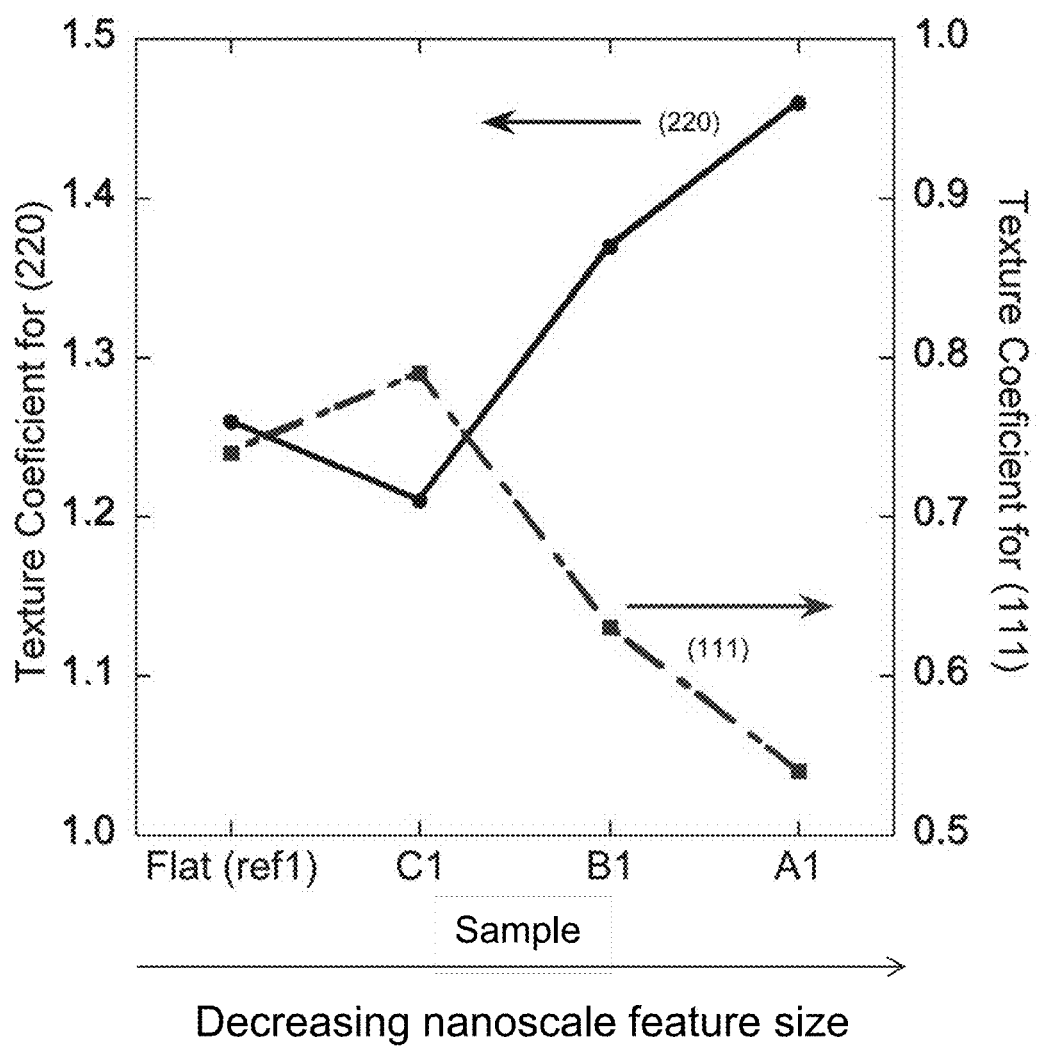
FIG. 7 is a plot showing texture coefficients for 1 µm thick diamond films grown on a flat substrate and on three nanopatterned substrates.

The plot in FIG. 7 summarizes the XRD data from plots similar to those in FIG. 6 for all of the nanopatterned feature sizes studied. It can be observed from FIG. 7 that the preferred (110) orientation texture intensity increases and the (111) orientation texture decreases with decreasing feature size in the substrate, indicating a direct correlation between substrate feature size and orientation texture of the polycrystalline diamond film grown thereon. FIG. 7 also suggests that further reduction in feature size may improve the (110) orientation texture dominance over the (111) orientation texture, thereby further improving the thermal properties of the polycrystalline diamond film.

Figure 8:
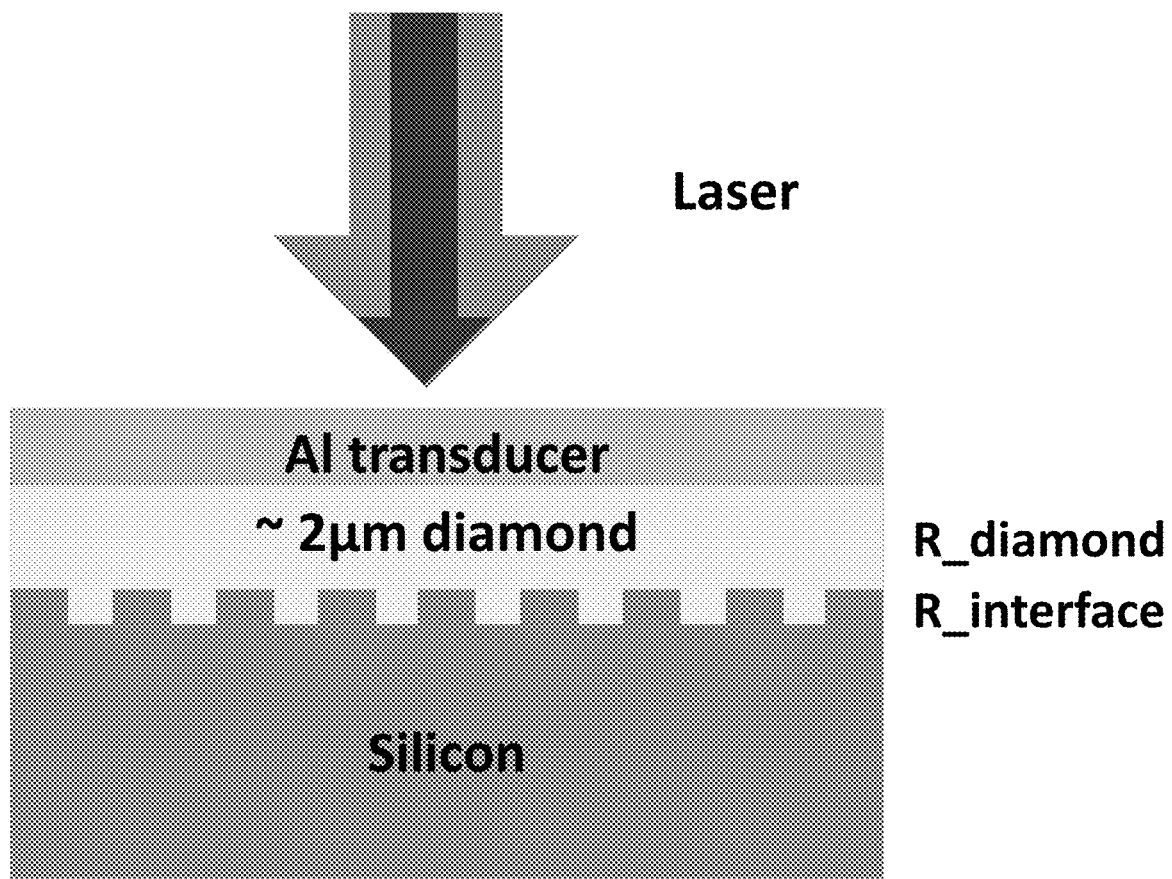
FIG. 8 is a block schematic illustrating an exemplary thermal measurement technique using pump-probe time dependent thermal reflectance (TDTR) of a thin aluminum transducer situated on an upper surface of a diamond film grown on a nanopatterned substrate in accordance with the present invention.

The thermal properties of diamond films grown on nanopatterned substrates were evaluated by time dependent thermoreflectance (TDTR). See J. Anaya, et al., "Simultaneous determination of the lattice thermal conductivity and grain/grain thermal resistance in polycrystalline diamond," *Acta Materilia* 139, p 215-225, (2017). TDTR is a pump-probe femtosecond laser based technique. The diamond is heated with a pump laser in a manner illustrated by the block schematic in FIG. 8, which shows how an exemplary pump-probe laser beam can heat a thin aluminum transducer deposited on an upper surface of a thin polycrystalline diamond film on a nanopatterned substrate. The thermal resistance at the substrate/diamond interface (R_interface) and of the diamond film (R_diamond) are measured and are used to determine the thermal conductivity of the diamond films.

Figure 9:
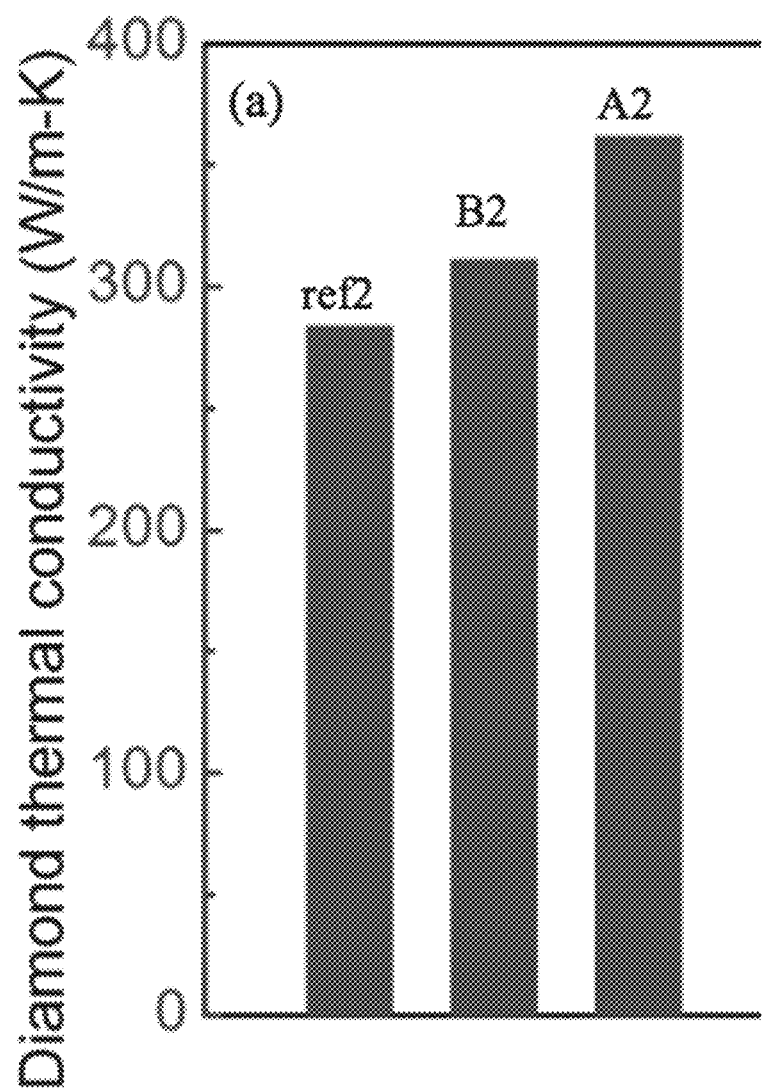
FIG. 9 is a plot illustrating the respective thermal conductivities of a 2 µm thick diamond film grown on a flat substrate and on two different patterned substrates.

The plot in FIG. 9 illustrates the results of a thermal conductivity comparison between a 2 μm-thick diamond film grown on a flat substrate (sample ref2) and on a nanopatterned sample having a trench top width of 60 nm (sample A2). As can be seen in the FIGURE, Sample A2 has approximately 30% higher thermal conductivity than Sample ref2. Further, as shown in Table I, the total thermal resistance of the diamond films grown on any of nanopatterned substrates A2, B2, or C2 is substantially lower than the resistance of the diamond film grown on the flat reference substrate, with the reduction in the thermal resistance correlating strongly with both film texture as shown by the ratio $I_{220}/I^{111}$ and trench feature size.

Advantages and New Features

The present invention provides a new way of growing thin diamond films by growing the films on a nanopatterned substrate to manipulate the microstructure and thermal conductivity of the polycrystalline diamond film. The result is a relatively thin film having thermal properties superior to those exhibited by films grown on flat, planar substrates.

Alternatives

Figure 10A:
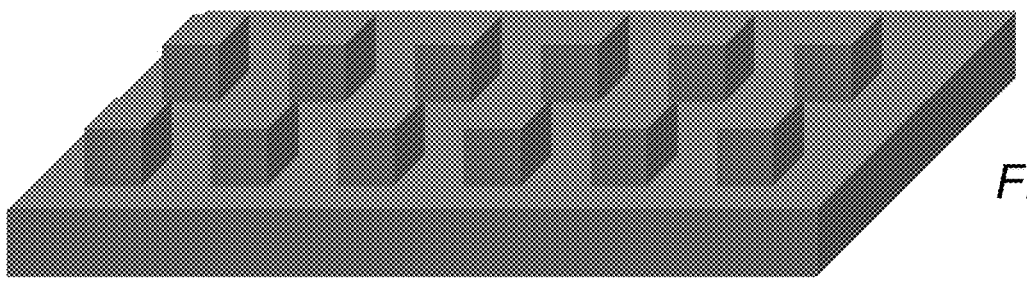
FIGS. 10A and 10B are block schematics illustrating two exemplary three-dimensional nanopatterned substrates on which diamond can be grown in accordance with the present invention.
Figure 10B:
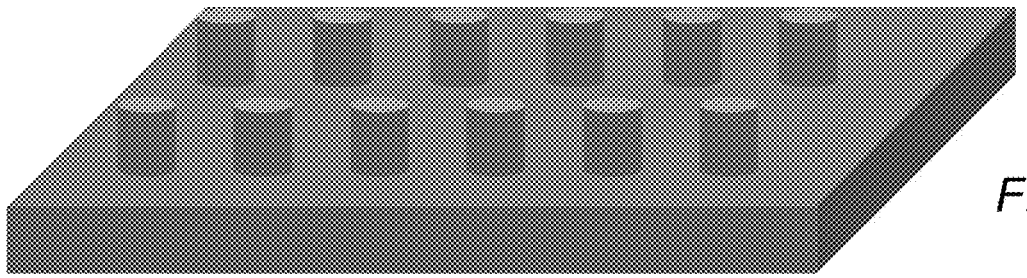

In the experiments described herein, a two-dimensional nanopatterned feature (i.e., a trench) was employed. However, other three-dimensional nanopatterned features such as the square pillars shown in FIG. 10A or the circular pillars shown in FIG. 10B could also be employed and would intensify the observed effect of promoting (110) oriented grains over (111) oriented grains.

In addition, the substrate need not be silicon. The concept should work on arbitrary substrates and surfaces with nanopatterned features such as silicon carbide, gallium nitride, aluminum gallium nitride, quartz, sapphire, and ultra-wide bandgap semiconductors including gallium oxide and boron nitride.

A novel method for employing a nanopatterned substrate for the growth of a polycrystalline diamond film to obtain a desired improvement in the diamond film's thermal conductivity has been described. Although particular embodiments, aspects, and features of the present invention have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A diamond structure in a semiconductor device, comprising:
    a substrate having a plurality of engineered uniform nanopatterned features fabricated on an upper surface thereof, each of the engineered nanopatterned features having a predetermined top width of about 4 to about 400 nm and having a predetermined distance from a neighboring feature; and
    a polycrystalline diamond film that conformally covers the nanopatterned features on the substrate;
    wherein the top width and distance between the nanopatterned features are engineered to cause initial diamond seed crystals deposited on the nanopatterned features to coalesce and grow in a vertical direction to produce the polycrystalline diamond film, the polycrystalline diamond film being dominated by grains having a <110>orientation texture that produces a predetermined increase in a thermal conductivity of the polycrystalline diamond film as compared to a polycrystalline diamond film grown on a flat substrate.

2. The diamond structure according to claim 1, wherein the nanopatterned features comprise a plurality of rectangular or circular pillars formed on the upper surface of the substrate.

3. The diamond structure according to claim 1, wherein the polycrystalline diamond film comprises seed diamond crystals having an initial grain size of about 4 nm.

4. The diamond structure in a semiconductor device according to claim 1, wherein nanopatterned features comprise a plurality of rectangular trenches having a height of 47 nm, a top width of 60 nm, and a bottom width of 77 nm.

5. The diamond structure in a semiconductor device according to claim 1, wherein nanopatterned features comprise a plurality of rectangular trenches having a height of 105 nm, a top width of 205 nm, and a bottom width of 215 nm.

6. The diamond structure in a semiconductor device according to claim 1, wherein nanopatterned features comprise a plurality of rectangular trenches having a height of 195 nm, a top width of 400 nm, and a bottom width of 435 nm.

7. The diamond structure in a semiconductor device according to claim 1, wherein the polycrystalline diamond film comprises initial diamond seed grains having an initial grain size of about 4 nm that have grown into grains having a grain size of about 100 to about 200 nm.

* * * * *